(12) United States Patent
Jansson et al.

(10) Patent No.: US 6,525,530 B1
(45) Date of Patent: Feb. 25, 2003

(54) CONTINUOUS SINE WAVE DRIVER FOR AN INDUCTIVE POSITION TRANSDUCER

(75) Inventors: Bjorn Jansson, Snohomish, WA (US); Michael M Nahum, Kirkland, WA (US)

(73) Assignee: Mitutoyo Corporation, Kawasaki (JP)

( * ) Notice: Subject to any disclaimer, the term of this patent is extended or adjusted under 35 U.S.C. 154(b) by 0 days.

(21) Appl. No.: 09/722,579

(22) Filed: Nov. 28, 2000

(51) Int. Cl.[7] .............................. G01B 7/14; G01B 7/02; H03B 5/08; H04B 5/00
(52) U.S. Cl. ......................... 324/207.17; 324/207.16; 331/117 R; 331/167; 455/41
(58) Field of Search ..................... 324/207.16–207.19, 324/207.24, 239; 455/41, 120–125; 331/117 R, 167; 336/45, 115, 129; 340/15, 870.32, 870.34–870.36; 318/653, 657, 661

(56) References Cited

U.S. PATENT DOCUMENTS

| | | | |
|---|---|---|---|
| 4,642,581 A | * | 2/1987 | Erickson |
| 4,737,698 A | | 4/1988 | McMullin et al. .......... 318/653 |
| 4,922,210 A | * | 5/1990 | Flachenecker et al. ...... 331/167 |
| 5,575,242 A | * | 11/1996 | Davis et al. |
| 5,886,512 A | | 3/1999 | Becerra ...................... 323/282 |
| 5,973,494 A | | 10/1999 | Masreliez et al. ...... 324/207.24 |
| 6,005,387 A | | 12/1999 | Andermo et al. ...... 324/207.17 |
| 6,011,389 A | | 1/2000 | Masreliez et al. ...... 324/207.17 |
| 6,212,431 B1 | * | 4/2001 | Hahn et al. |

* cited by examiner

*Primary Examiner*—Gerard R. Strecker
(74) *Attorney, Agent, or Firm*—Oliff & Berridge, PLC (57) ABSTRACT

A drive circuit for driving the transmitter windings of an inductive position transducer includes an oscillating power source. A resonator section is connected to the power source. The resonator section includes an impedance transforming section, a transmitter winding of the inductive position transducer, and feedback loops which cause the power source to oscillate at the resonator frequency. The resonator operating frequency and the load impedance imposed on the power source by the resonator can be independently selected. In various exemplary configurations of the drive circuit, the resonator operating frequency adapts to variations in the impedance of the transmitter windings. The drive circuit is particularly well-suited for driving low-impedance and/or miniaturized inductive position transducers with enhanced efficiency and accuracy. In various exemplary configurations of the drive circuit, the peak operating voltage of the transmitter windings can exceed the power supply voltage.

35 Claims, 6 Drawing Sheets

CONTINUOUS SINE WAVE DRIVER FOR AN INDUCTIVE POSITION TRANSDUCER

BACKGROUND OF THE INVENTION

1. Field of Invention

This invention relates to electronic circuits for driving the transmitter winding of an inductive position transducer.

2. Description of Related Art

Inductive position transducers are widely used to measure relative displacements between one or more receiver windings and one or more windings or disrupting elements that modulate the inductive coupling between the receiver windings and a transmitter winding. In various conventional inductive position transducers, such as those disclosed in U.S. Pat. No. 6,005,387 to Andermo et al. and 6,011,389 to Masreliez et al., each incorporated by reference herein in its entirety, a lower power, intermittent drive circuit is used to supply a time-varying drive signal to the transmitter windings. In the 389 and 387 patents, the intermittent drive circuit discharges a capacitor through the inductor formed by the transmitter winding. This causes the transmitter winding to "ring". That is, the current released by connecting the charged capacitor to ground through the inductor formed by the transmitter winding and a serially-connected resistor oscillates and exponentially decays.

This circuit provides a clean sinusoidal signal having a single fundamental frequency that is directly dependent on the inductance of the transmitter winding. However, to use this decaying ringing signal, the peak amplitude of the largest peak in the signal must be carefully sampled to be able to accurately determine the relative position between the receiver windings and the disrupting elements and/or coupling loops. Moreover, because the ringing circuit quickly decays, only a single sample can be taken of this signal each time the capacitor is charged and then subsequently discharged through the inductor formed by the transmitter winding.

In contrast, in various other conventional systems, the transmitter winding is continuously driven. U.S. Pat. No. 4,737,698 to McMullin et al. discloses a system that uses a continuously driven inductive transducer. For example, the 698 patent discloses a power oscillator that runs at a frequency of 10 kHz to 1 MHz. This low frequency range indicates that the load inductance on the power oscillator is large. As is well-known in the art, large load inductances, and therefore large load impedances, are easier to drive than inductive transducers having small inductances, and therefore small impedances.

As disclosed in the 698 patent, a single capacitor can be connected in parallel with the transmitter winding to form a resonant tank circuit that increases the impedance. This is shown, for example, in FIG. 9. However, the 698 patent indicates this is optional, suggesting that for the transmitter windings disclosed in the 698 patent, the impedance need not be specifically tuned to resonate at the oscillation frequency, and/or that inductance of the transmitter winding need not participate in determining the oscillation frequency. The 698 patent also discloses that the parallel capacitor is located at the transmitter winding.

However, the 698 patent does not provide any suggestion of the location of the power oscillator, implying that the location of the power oscillator is not critical. Since a power oscillator located remotely from the transmitter winding must drive relatively unpredictable wiring impedances in addition to the circuit elements at the transmitter winding, this again suggests that for the transmitter windings disclosed in the 698 patent, the impedance need not be specifically tuned to resonate at the oscillation frequency and/or that inductance of the transmitter winding need not participate in determining the oscillation frequency.

Figure 7:
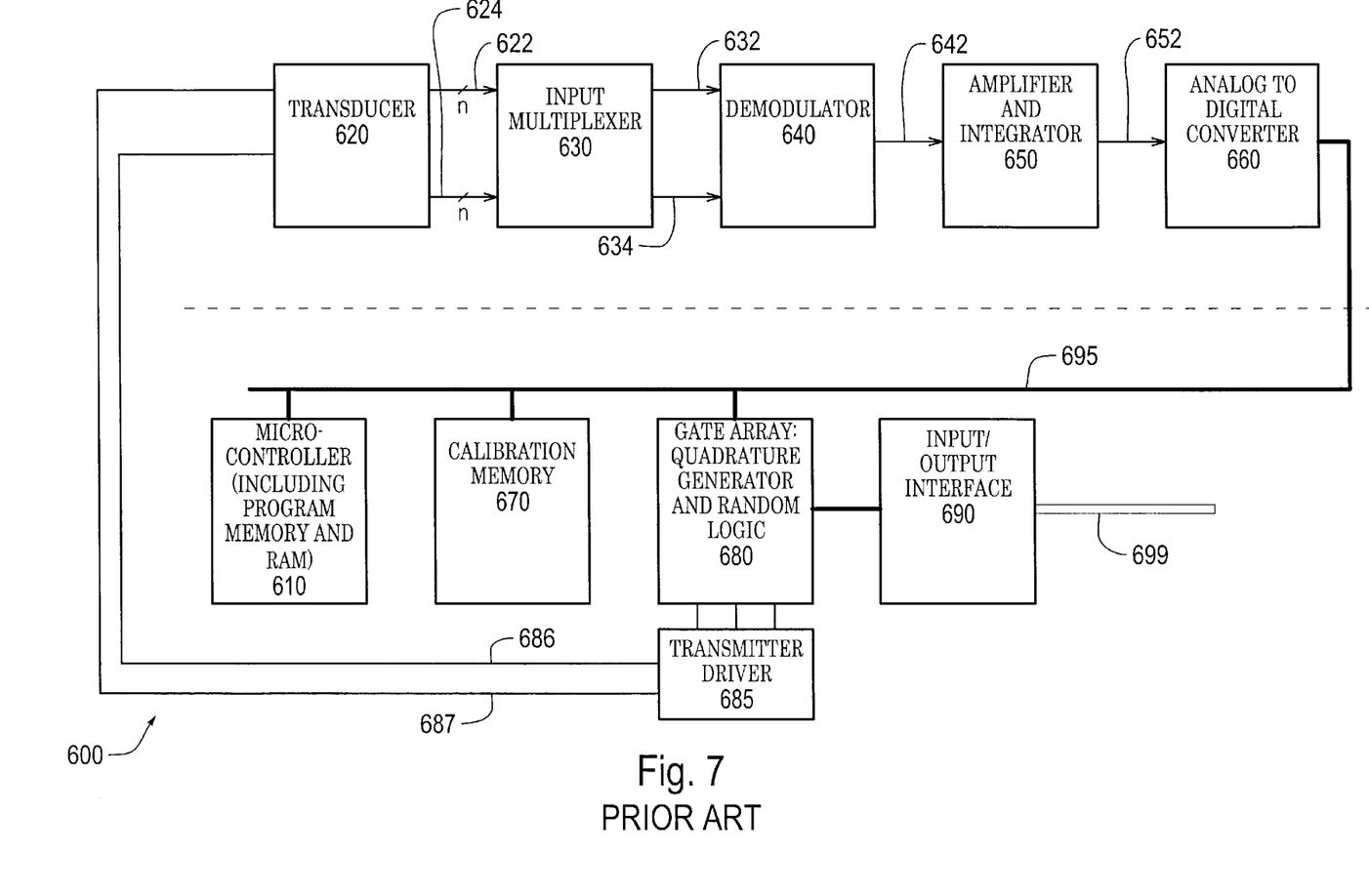
FIG. 7 is a block diagram of a conventional inductive position transducer, signal processing circuit and transmitter driver.

In yet other various conventional systems, the inductive position transducer is incorporated into a readhead, such as those used in hand-held calipers, linear scales and other position transducing systems that measure distances to relatively high accuracy and resolution. FIG. 7 shows a block diagram of the transducer, signal processing circuit and transmitter driver of one such conventional position transducer 600. As shown in FIG. 7, a program microcontroller 610, which includes program memory and RAM, a calibration memory 670 and a gate array 680 are connected to a data bus 695. The gate array 680 is connected to and controllably drives a transmitter driver 685. The transmitter driver 685 is connected to a dual-scale transducer 620 over a pair of drive signal lines 686 and 687.

The dual-scale transducer 620 includes a first scale having a first transmitter winding and a first set of receiver windings and a second scale having a second transmitter winding and a second set of receiver windings. The first set of receiver windings are connected over the signal lines 622 to an input multiplexer 630, while the second set of receiver windings are connected over the signal line 624 to the input multiplexer 630. The input multiplexer 630 selectively connects the first or second receiver windings to a synchronous demodulator 640 over a pair of signal lines 632 and 634. The synchronous demodulator 640 synchronously demodulates the induced signal in the first or second set of receiver windings generated by continuously driving the first or second transmitter winding. The synchronous demodulator 640 outputs the synchronously demodulated received signal over a signal line 642 to an amplifier and integrator 650.

The amplifier and integrator 650 amplifies the synchronously demodulated received signal and integrates it to generate a position signal corresponding to the relative position between the set of receiver windings used to generate the synchronously demodulated receiver signal and either or both of a set of disruptive elements or a set of coupling windings. The amplifier and integrator 650 outputs an amplified and integrated position signal over a signal line 652 to an analog-to-digital converter 660 that converts the analog signal to a digital signal. The digital signal is then output over the databus 650 to the microcontroller 610. The microcontroller 610 analyzes the digital signal to determine a relative position for the inductive position transducer 620.

This relative position is then output over the databus 695 to the gate array 680. The gate array 680 then outputs the position signal, either in quadrature form or as a numeric value, to the input/output interface 690. The input/output interface 690 then outputs the signals to a signal line 699, which can be connected to a display device for displaying the numeric value of the position signal or to a control system, such as a numerically-controlled machine tool, that uses the quadrature signals as control signals.

Figure 8:
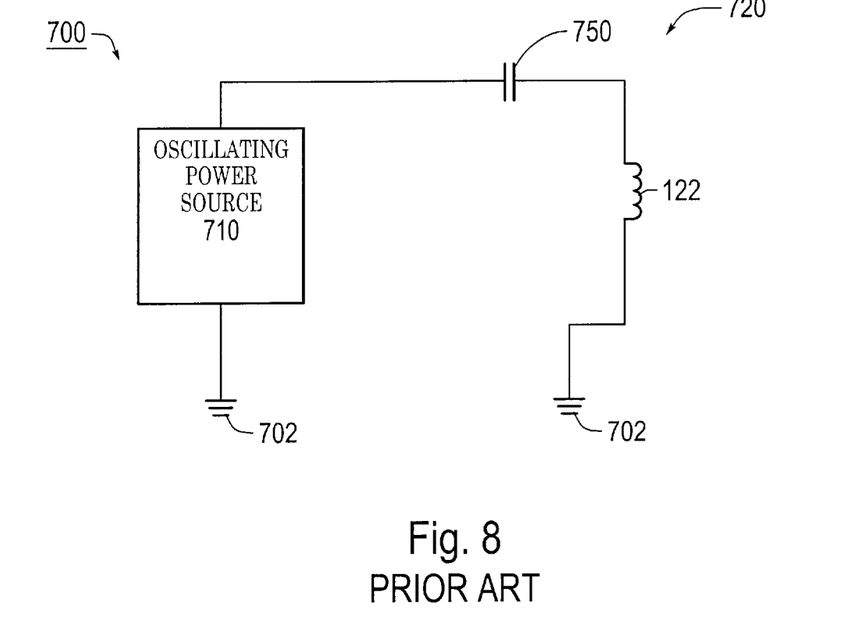
FIG. 8 is a schematic diagram of a first conventional continuous digital transmitter driver.

FIG. 8 shows one exemplary embodiment of a digital drive circuit 700 that imposes a square wave on an impedance-adjusted serially-connected inductive-capacitive circuit 720. In this case, the inductor of the serially-connected inductive-capacitive circuit 720 is formed by the transmitter winding 122 of the transducer 620. This is shown in FIG. 8 for a digital drive circuit that is used to drive the transmitter winding 122 of the transducer 620, using an oscillating power source 710 that is connected between ground 702 and the impedance-adjusted serially-connected inductive-capacitive circuit 720. In particular, the impedance-adjusted serially-connected inductive-capacitive circuit 720 comprises a capacitor 750 connected in series with the first transmitter winding 122 between the output of the oscillating power source 710 and ground 702. The digital drive circuit 700 shown in FIG. 8 relies on frequency discrimination provided by this impedance-adjusted serially-connected inductive-capacitive circuit 720 to convert the square wave imposed on the impedance-adjusted serially-connected inductive-capacitive circuit 720 into an approximate sine wave.

Figure 9:
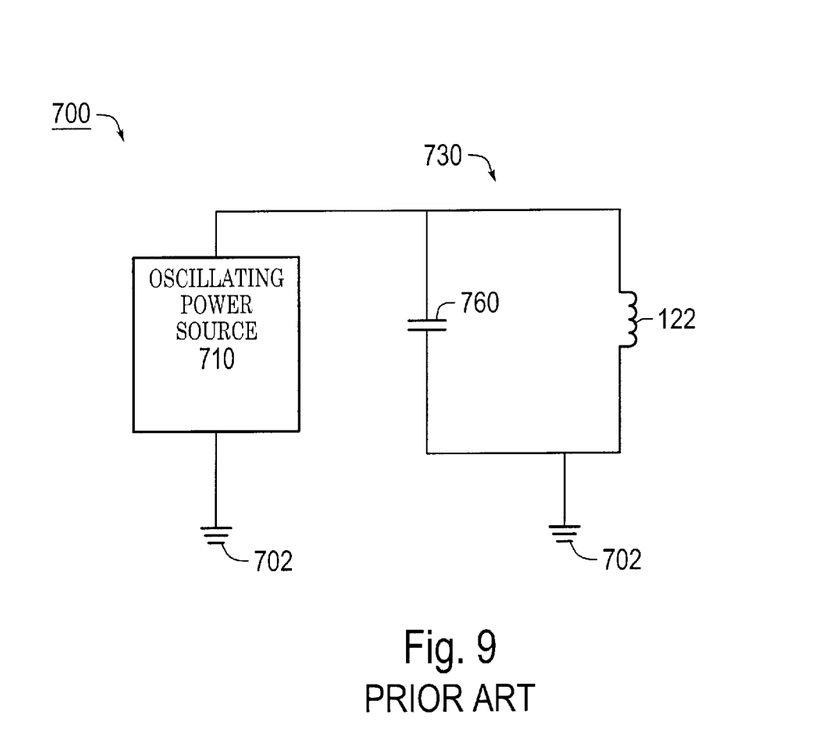
FIG. 9 is a schematic diagram of a second conventional continuous digital transmitter driver.

FIG. 9 shows a second exemplary embodiment of a digital drive circuit 700 that imposes a square wave on an impedance-adjusted parallel inductive-capacitive circuit 730. In this case, the inductor of the impedance-adjusted parallel inductive-capacitive circuit 730 is formed by the transmitter winding of the transducer 620. This is shown in FIG. 9 for a digital drive circuit that is used to drive a transmitter winding 122 of the transducer 620, using an oscillating power source 710 that is connected between ground 702 and the impedance-adjusted parallel inductive-capacitive circuit 730. In particular, the impedance-adjusted parallel inductive-capacitive circuit 730 comprises a capacitor 760 connected in parallel with the transmitter winding 122 between the output of the oscillating power source 710 and ground 702. The digital drive circuit 700 shown in FIG. 9 relies on frequency discrimination provided by this impedance-adjusted parallel inductive-capacitive circuit 730 to convert the square wave imposed on the impedance-adjusted parallel inductive-capacitive circuit into an approximate sine wave.

SUMMARY OF THE INVENTION

It should be appreciated that the conventional driver circuits, described above, and minor variations of these conventional driver circuits, have provided suitable design solutions that are sufficient for the available and anticipated inductive position transducers and their associated transmitter windings. The conventional driver circuits and the associated design solutions have not been considered problematic, when used in inductive position transducers. As a result, driver circuits of significantly wider utility and/or significant design advantages have not been known or available for inductive position transducers. However, to extend the economy, utility, and/or accuracy of inductive position transducers, and to enable the use of miniaturized transducers manufactured using advanced techniques, the inventors have recognized that new driver circuits, offering characteristics previously unknown in inductive position transducers, are required.

That is, the above-described conventional driver circuits for an inductive transducer have various problems which make them unsuitable when attempting to accurately measure extremely small displacements at extremely high resolution, and especially when using compact inductive transducers which exhibit relatively low transmitter winding impedance. For example, the design and description of the continuously-driven inductive transducer disclosed in the 698 patent suggests a relatively large impedance and, therefore, a relatively low operating frequency and/or sample rate.

In contrast, in many applications requiring measurement during motion, inductive position transducers are advantageously operated with a very high operating frequency and/or sample rate, especially when attempting to accurately measure extremely small increments of high-speed motion at extremely high resolution.

It should also be noted that, when the inductance of the drive winding does not participate in determining the oscillation frequency of the above-described conventional drive circuits, the transducer signal output is detrimentally reduced to the extent that the oscillation frequency of the transmitter winding does not coincide with the resonant frequency of the transmitter winding. Additionally, while the transmitter winding drive circuits disclosed in the 389 and 387 patents are suitable for inductive position transducers designed to measure small displacements at high resolutions, they are generally most applicable for intermittent operation at low speed, and /or for low-power applications. They cannot provide the performance advantages of continuously driven transmitter winding drive circuits at relatively higher speeds and/or resolutions.

Also, while the digital drive circuits shown in FIGS. 8 and 9 can be continuously driven, and are, in various exemplary embodiments, suitable for driving an inductive position transducer capable of measuring extremely small displacements at high resolution, the approximate sine wave generated in the transmitter windings by these digital drivers has a number of harmonic components that significantly degrade measurement accuracy, complicate the signal processing circuitry, and produce unnecessary radiated electromagnetic emissions that are detrimental to the environment and that complicate the transducer layout and packaging.

Furthermore, when measuring small displacements at extremely high resolutions using small or miniaturized inductive transducers, the available signal from the miniaturized transducers is inherently reduced by their small size. Therefore, in order to attain the desired signal-to-noise ratio in such miniaturized inductive position transducers, the signal through the transducer should be maximized to compensate for the small size of miniaturized inductive position transducers. However, in many cases, the transmitter winding of such miniature inductive position transducers has only a small inductance, and thus only a small impedance. Such small impedances are difficult to drive.

In order to solve this problem, the inventors have eventually studied a class of circuits known in the field of RF circuit design as impedance transformers. However, the inventors have found that the impedance characteristics of the transmitter windings of practical and compact inductive position transducers are not characteristic of the problems conventionally studied and solved by impedance transformers in the field of practical RF circuit design. In particular, the inventors have found that many of the impedance transformer circuits developed in the field of RF circuit design are inappropriate or impractical to use in inductive position transducers, due to, for example, cost, size, or electrical interference problems.

In other cases, the inventors have found that with actual components, that is, non-ideal components, the impedance transformer circuits designed according to conventional principles of RF circuit design do not behave as conventionally predicted for the range of circuit characteristics associated with practical advanced inductive position transducers. Furthermore, the inventors have found that the combination of circuit parameters that significantly improves the performance of actual advanced inductive position transducers deviates from the solutions determined according to conventional principles in the field of RF circuit design.

Accordingly, this invention has been particularly developed to provide a desirable set of characteristics when applied to various practical inductive position transducers.

This invention provides a drive circuit for driving various inductive position transducers with enhanced efficiency and accuracy.

This invention further provides a drive circuit for driving low-impedance and/or miniaturized inductive position transducers with enhanced efficiency and accuracy.

This invention further provides a drive circuit for driving low-impedance and/or miniaturized inductive position transducers with enhanced efficiency and accuracy at high operating frequencies.

This invention separately provides a drive circuit for an inductive position transducer that generates a more pure sine wave.

This invention further provides a drive circuit for an inductive position transducer that uses a linear amplifier to generate the more pure sine wave.

This invention additionally provides a drive circuit for an inductive position transducer that uses the linear amplifier and an oscillator configuration to generate the more pure sine wave.

This invention separately provides a transmitter driver for an inductive position transducer that determines the oscillation frequency based on the transmitter winding inductance.

This invention further provides a driver circuit for an inductive position transducer that uses the transmitter winding as part of the resonator that determines the oscillation frequency.

This invention separately provides a driver circuit having at least two degrees of freedom for determining the operating characteristics of an inductive position transducer.

This invention further provides a transmitter driver for an inductive position transducer that uses two capacitors in the resonant circuit to provide at least two degrees of freedom.

This invention additionally provides a transmitter driver for an inductive position transducer that uses a resonant circuit having a first capacitor in series with the transmitter winding and a second capacitor in parallel with the serially-connected first capacitor and transmitter winding.

This invention separately provides a transmitter driver for an inductive position transducer that allows the transmitter voltage to exceed the power supply voltage.

In various exemplary embodiments of the transmitter windings driven according to this invention, the transmitter driver for the inductive position transducer includes, for each separate transmitter winding, at least one operational amplifier. In various exemplary embodiments, a first feedback loop between the output of the operational amplifier and an inverting input of the operational amplifier is provided to provide a bias and set the gain for the operational amplifier. A second feedback loop, including the resonator circuit that includes the transmitter winding, is formed between the output of the operational amplifier and the non-inverting input of the operational amplifier.

In various other exemplary embodiments, the transmitter driver according to this invention includes a single-ended operational amplifier-based oscillator. In various other exemplary embodiments, for each transmitter winding, the transmitter driver includes a double-ended operational-amplifier based oscillator. In still other exemplary embodiments, the transmitter driver includes, for each transmitter winding, a digital driver. In all these exemplary embodiments, the resonant circuit including the transmitter winding includes a first capacitor connected in series with the inductor provided by the transmitter winding and a second capacitor connected in parallel to the serially-connected first capacitor and transmitter winding.

These and other features and advantages of this invention are described in, or are apparent from, the following detailed description of various exemplary embodiments of the transmitter winding driver according to this invention.

BRIEF DESCRIPTION OF THE DRAWINGS

Various exemplary embodiments of this invention will be described in detail, with reference to the following figures, wherein.

DETAILED DESCRIPTION OF EXEMPLARY EMBODIMENTS

A sine wave contains only a single frequency. In contrast, other wave forms, such as, for example, square waves and distorted sine waves, contain multiple frequencies. The overall transfer function of an inductive position transducer, such as the inductive position transducers disclosed in the incorporated 387 and 389 applications, will vary with frequency. In addition, the characteristics of the overall transfer function of these inductive position transducers can differentially drift with age, humidity and/or temperature at different frequencies. Accordingly, to improve the stability of the operation of such inductive position transducers, a single frequency driver for the transmitter winding is desirable.

Additionally, when the single frequency for this single frequency driver corresponds to the resonance frequency of the transducer, such a single-frequency driver signal will also exhibit a reduced amount of attenuation as the single-frequency driver signal passes through the inductive position transducer. Of course, reducing the amount of attenuation of the signal improves the efficiency of the circuit and the signal to noise ratio of the transducer.

In general, if one or more properties, such as those outlined above, of the transducer drift over time, a single frequency driver that can track the peak sensitivity of the transducer, that is, oscillate at the resonant frequency of the transducer, will produce higher signal strength under varying conditions relative to a fixed-frequency driver for the transmitter winding. Additionally, as the Q-value of the transducer and the transmitter winding driver increases, this frequency-tracking property becomes increasingly important, as the transducer resonator will increasingly attenuate frequencies deviating from the resonant peak.

Figure 1:
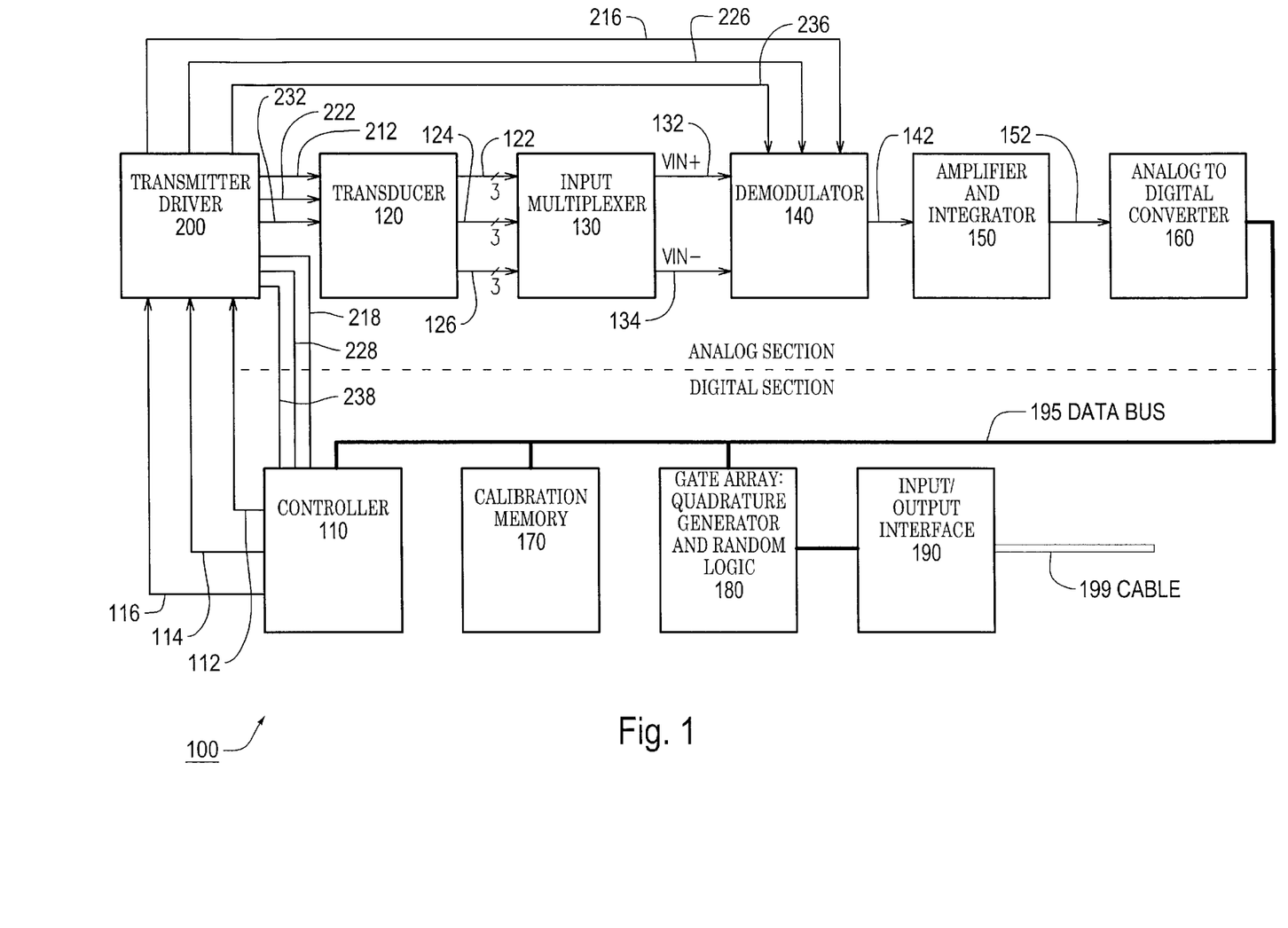
FIG. 1 is a block diagram of one exemplary embodiment of an inductive position transducer incorporating the transmitter driver according to this invention.

FIG. 1 is a block diagram illustrating one exemplary embodiment of an inductive position transducer that incorporates the transmitter driver according to this invention. As shown in FIG. 1, the inductive position transducer 100 includes a controller 110 connected over signal lines 112, 114 and 116, and signal lines 218, 228 and 238, to a transmitter driver 200. The transmitter driver 200 outputs driver signals for the transmitter windings of a transducer 120 over signal lines 212, 222 and 232 for a three-scale transducer. The transducer 120 outputs position-dependent signals from the receiver windings over the signal lines 122, 124 and 126 to an input multiplexer 130. In particular, if the transducer 120 uses three-phase receiver windings, each of the signal lines 122, 124 and 126 will comprises three separate signal lines.

In this exemplary embodiment, the transmitter driver 200 continuously drives one or more of the different transmitter windings in the transducer 120, based on the enable signals output over the signal lines 112, 114 and 116. Thus, the input multiplexer 130 selectively passes the position-dependent receiver signals on the signal lines 122, 124 and 126 to a synchronous demodulator 140 over the signal lines 132 and 134. The synchronous demodulator 140 also inputs synchronous demodulation control signals over the signal lines 216, 226 and 236 from the transmitter driver 200. The synchronous demodulator 140 synchronously demodulates the position-dependent receiver signals generated by the transducer 120 and output through the input multiplexer 130 and outputs the synchronously demodulated signal over the signal line 142 to an amplifier and integrator 150.

The amplifier and integrator 150 amplifies the synchronously demodulated signal received over the signal line 142 and integrates the amplified signal to improve the signal-to-noise ratio, thereby increasing the attainable resolution, and outputs the amplified and integrated signal over the signal line 152 to the analog/digital converter 160. The analog/digital converter 160 converts the analog amplified and integrated signal received over a signal line 152 to a digital signal that can be used by the controller 110 and/or stored in a memory portion of the controller 110 and/or the calibration memory 170. In particular, the analog/digital converter 160 outputs the digital data signal over a digital databus 195.

Each of the controller 110, the calibration memory 170 and a gate array 180 are connected to the digital databus 195. The gate array 180 is usable to convert the three-phase receiver signals output by the transducer 120 into two-phase, quadrature signals usable by such devices as numerically controlled machine tools and the like. The gate array 180 can also incorporate any additional digital logic that is necessary or desirable to include in the inductive position transducer 100.

The gate array 180 is connected to an input/output interface 190. The input/output interface 190 can be connected to a cable 199 that is connectable to a downstream device, such as a numerically controlled machine tool. Alternatively, the input/output interface 190 and/or the cable 199 can be connected to a display device to display a position signal or numerical value derived by the controller 110 and/or the gate array 180 from the digital data signal output by the analog/digital converter 160 that represents the displacement between the scale elements of the transducer 120 and the readhead elements of the transducer 120.

In general, the overall operation of the inductive position transducer 100 is described in detail in the incorporated 387 and 389 patents, as well as in U.S. Pat. Nos. 5,973,494 and 5,886,519 to Masreliez et al., each incorporated herein by reference in its entirety.

Figure 2:
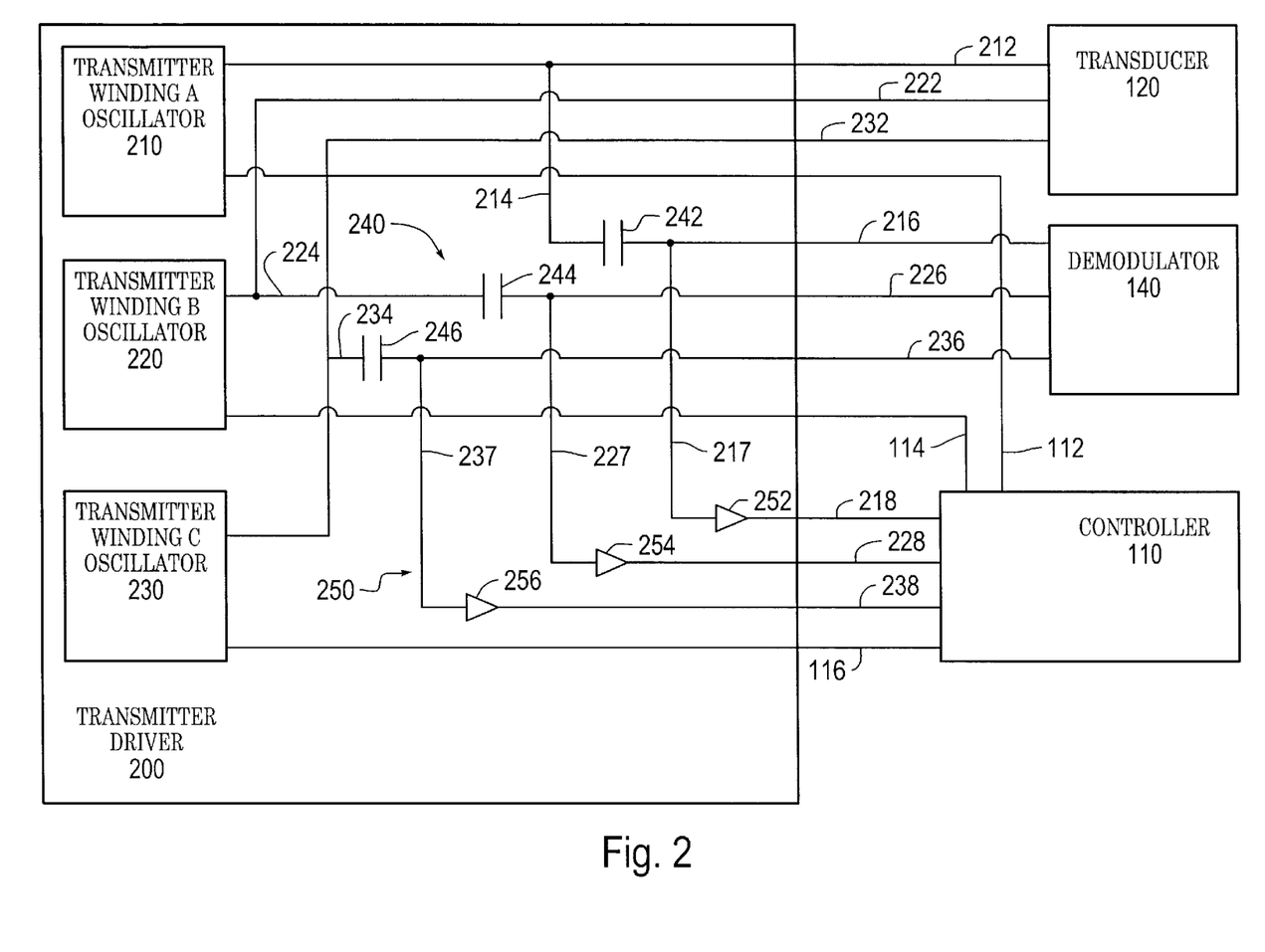
FIG. 2 is a block and schematic diagram showing in greater detail a first exemplary embodiment of the transmitter driver of FIG. 1.

FIG. 2 is a combined block and schematic diagram illustrating one exemplary embodiment of the transmitter driver 200 of FIG. 1. As shown in FIG. 2, for a three-scale transducer 120, the transmitter driver 200 includes a transmitter winding A oscillator 210, a transmitter winding B oscillator 220 and a transmitter winding C oscillator 230, each respectively connected to the first, second and third transmitter windings A–C of the three scales of the transducer 20.

In particular, as shown in FIG. 2, the drive signal output by the transmitter winding A oscillator 210 is output over the signal line 212 to the first transmitter winding A of the transducer 120. Similarly, the drive signal output by the transmitter winding B oscillator 220 is output over the signal line 222 to the second transmitter winding B of the transducer 120. Finally, the drive signal output by the transmitter winding C oscillator 230 is output over the signal line 232 to the third transmitter winding C of the transducer 120.

The controller 110 outputs enable signals to the transmitter driver 200 to enable the three transmitter winding oscillators 210, 220 and 230. In particular, the controller 110 outputs a first enable signal over the signal line 112 to the transmitter winding A oscillator 210. Similarly, the controller 110 outputs a second enable signal over the signal line 114 to the transmitter winding B oscillator 220. Likewise, the controller 110 outputs a third enable signal over the signal line 116 to the transmitter winding C oscillator 230. The operation of these enable signals will be discussed in greater detail below.

As further shown in FIG. 2, the transmitter driver 200 includes a capacitor portion 240 and a buffer portion 250. The capacitor portion 240 includes a first capacitor 242, a second capacitor 244 and a third capacitor 246, associated, respectively, with the transmitter winding oscillators 210–230. In particular, a signal line 214 connected to the signal line 212 is connected to a first terminal of the first capacitor 242. The second terminal of the first capacitor 242 is connected to the signal line 216, which is connected to the synchronous demodulator 140. Similarly, a first terminal of the second capacitor 244 is connected by a signal line 224 to the signal line 222. The other terminal of the second capacitor 244 is connected to the signal line 226, which is connected to the synchronous demodulator 140. Finally, a first terminal of the third capacitor 246 is connected by a signal line 234 to the signal line 232 from the transmitter winding C oscillator 230. The second terminal of the third capacitor 246 is connected to the signal line 236, which is connected to the synchronous demodulator 140, as indicated above.

As further shown in FIG. 2, the buffer portion 250 includes a first buffer 252, a second buffer 254 and a third buffer 256. An input terminal of the first buffer 252 is connected by a signal line 217 to the signal line 216 of the transmitter winding A oscillator 210. The output terminal of the first buffer 252 is connected to the signal line 218, which, as indicated above, is connected to the controller 110.

Likewise, the input terminal of the second buffer 254 is connected by a signal line 227 to the signal line 226 of the transmitter winding B oscillator 220. The output terminal of the second buffer 254 is connected to the signal line 228, which is connected to the controller 110. Finally, the input terminal of the third buffer 256 is connected to a signal line 237, which is connected to the signal line 236. The output terminal of the third buffer 256 is connected to the signal line 238, which is connected to the controller 110. The capacitors 242, 244, and 246 block DC voltages imposed on the signal lines 216, 226, and 236 by the demodulator 140. The first-third buffers 252 256 convert the sinusoidal signals on the signal lines 216, 226, and 236 to square-waves on the signal lines 218, 228, and 238.

Figure 3:
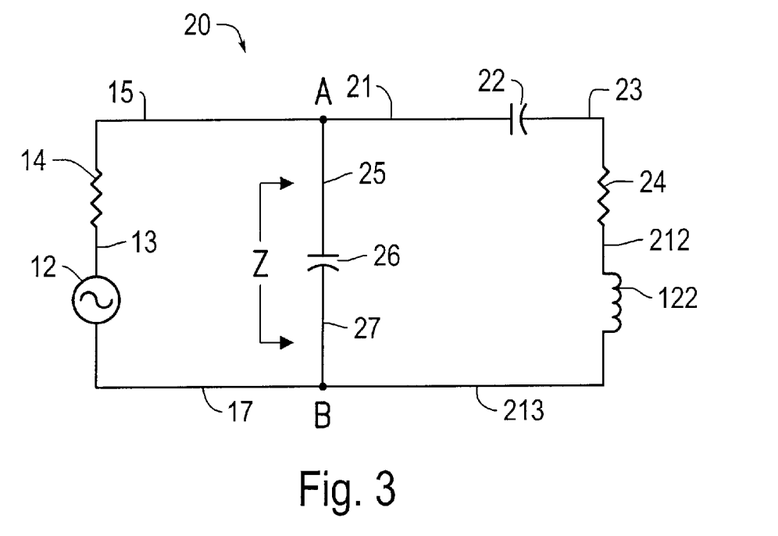
FIG. 3 is a schematic diagram illustrating one exemplary embodiment of the circuit principles underlying this invention.

FIG. 3 is a schematic of a general circuit that illustrates the operative principles behind various exemplary embodiments of the transmitter winding oscillators 210 230 according to this invention.

In general, to create a resonant circuit that includes a transmitter winding, which forms a coil or inductor, there are two "pure" circuit approaches, a series resonant circuit and a parallel resonant circuit. In the series resonant circuit, as illustrated in FIG. 8, all reactance cancels at resonance. In this case, the impedance of the series resonant circuit is defined solely by the stray resistances in the transmitter coil and in the series capacitor. This impedance is typically less than 1Ω resistive. Such a low resistance is difficult to drive, because most reasonable continuous drivers have output impedances of several ohms. Thus, such reasonable continuous drivers will only inefficiently work with such a low load impedance. Other reasonable continuous drivers may have a similar output impedance, but the excessive current drawn by a 1Ω resistive load exceeds the range of normal function of the components of such drives, and introduces other unwanted problems.

The parallel resonant circuit, as illustrated in FIG. 9, in contrast, poses the opposite problem. The parallel resonant circuit is, in fact, the limiting case for high impedance in a resonant circuit. However, such high impedance means that it is difficult to push significant amounts of power through the parallel resonant circuit. Obviously, in such a case, when the parallel resonant circuit is used in an inductive position transducer, the transmitter voltage of the transmitter windings can never exceed the power supply. In fact, the transmitter voltage of the transmitter winding will at best only approach the power supply voltage.

In particular, at resonance, the impedance of the parallel resonant circuit is purely resistive. Thus, the parallel resonant circuit degenerates into a voltage divider. The transmitter voltage across the transmitter winding is thus the voltage divider voltage that results from a voltage divider created by the source impedance and the resulting resistance of the parallel resonant circuit.

In the transmitter winding oscillators according to this invention, the transmitter voltage across the transmitter winding is increased, and is ideally maximized. Of course, there will always be some distributed stray resistance in the transmitter winding. In view of this stray resistance, to increase, and ideally maximize, the voltage across the transmitter winding, the power dissipated in this stray resistance should be increased, and ideally maximized.

To increase, and ideally maximize, the power dissipated in the stray resistance, the impedance of the load should approach, and ideally match, the impedance of the output of the transmitter winding driver. This relies on the well-known circuit principles that impedance matching maximizes the power delivered to the load.

For the inductive position transducers being driven using the circuit principles according to this invention, matching the load impedance, or at least approaching the impedance of the load, in various exemplary embodiments, is desirably accomplished by canceling the reactance of the transmitter winding and by incorporating the stray resistance into a desired load resistance. According to this invention, this is accomplished using a circuit that combines features of both the series and parallel resonant circuits. FIG. 3 illustrates such a combined series and parallel resonant circuit, the impedance transformer 20.

As shown in FIG. 3, the inductor 122 represents an individual one of the transmitter windings of the transducer 120 shown in FIG. 2. In particular, the inductance L of the inductor 122 is the inductance of the transmitter loop in the transducer 120.

As shown in FIG. 3, the impedance transformer 20, having an impedance Z, comprises a first capacitor 22, a second capacitor 26, a resistor 24 and an inductor 122. Furthermore, as shown in FIG. 3, a signal generator 12 is connected by a signal line 13 to a resistor 14. The other end of the resistor 14 is connected by a signal line 15 to a first node, the input node A. The input node A is connected by a signal line 21 to the first capacitor 22. A signal line 25 connects the input node A to the second capacitor 26. A signal line 23 connects the first capacitor 22 to the resistor 24, while a signal line 212 connects the resistor 24 to the inductor 122. A signal line 213 connects the inductor 122 to a node B. A signal line 17 connects the node B to the signal generator 12. A signal line 27 connects the second capacitor 26 to the node B.

Thus, as shown in FIG. 3, the first capacitor 22, the resistor 24 and the inductor 122 form a series RCL circuit between the nodes A and B. Furthermore, the second capacitor 26 is connected in parallel with this RCL series circuit between the nodes A and B.

The resistor 24 is the stray resistance in the transmitter loop formed by the transmitter winding 122. The first capacitor 22 is thus the series capacitor, while the second capacitor 26 is the parallel capacitor.

The combined input impedance Z of the first and second capacitors 22 and 26, the resistor 24 and the inductor 122 is the load on the signal generator 12. The resistor 14 is the output resistance R of the signal generator 12 to which the input impedance Z of the impedance transformer 20 is matched. In particular, by choosing the capacitances $C_1$ and $C_2$ of the first and second capacitors 22 and 26 appropriately, the impedance Z will equal the resistance $R_s$ of the resistor 14 of the signal generator 12.

It should be appreciated that, in the impedance transformer 20 according to this invention, the topology of the impedance transformer 20 is determined by the relative values of the resistance $R_1$ of the resistor 24 and the resistance $R_s$ of the source resistor 14. If the resistance $R_1$ of the resistor 24 is less than the resistance $R_s$ of the source resistor 14, the first element to the "left" of the load should be a series element. The parallel element then follows. Of course, if the relationship was reversed, such that the resistance RI of the resistor 24 is greater than the resistance $R_s$ of the source resistor 14, the first element to the "left" of the load should be the parallel element. In this case, the series element would then follow.

It should further be appreciated that the series and parallel elements forming the input impedance Z are not necessarily capacitors. That is, in some exemplary embodiments, the series and parallel elements can be inductors. However, usually, in the transmitter driver 200 according to this invention for driving a transmitter winding that forms the inductor 122, capacitors will almost always be used as the series and parallel circuit elements.

Figure 4:
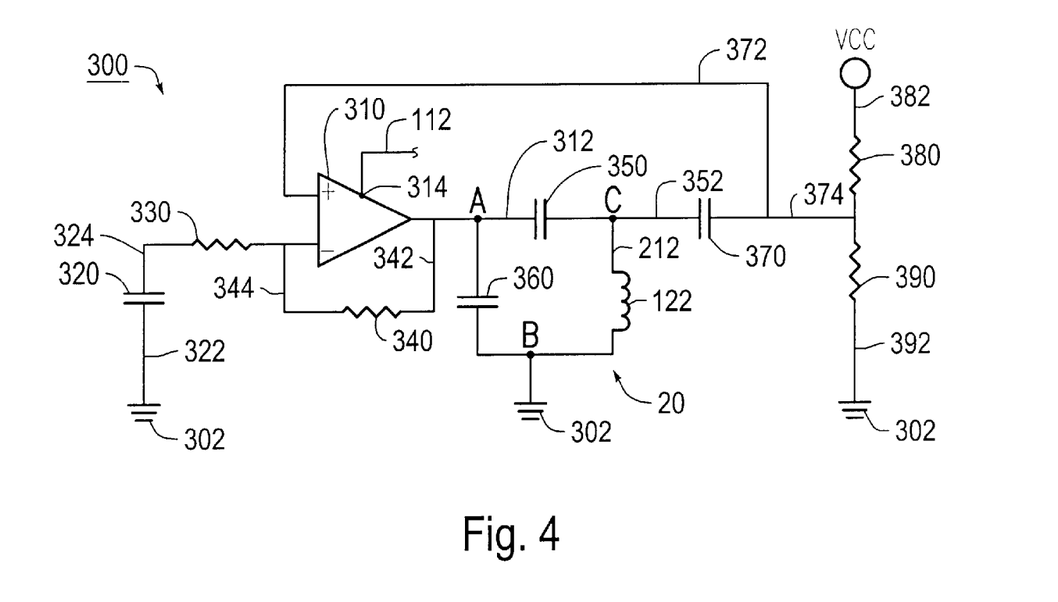
FIG. 4 is a schematic diagram of a first exemplary embodiment of a transmitter winding oscillator and associated transmitter winding of FIG. 2.

FIG. 4 is a circuit diagram of a first exemplary embodiment of a transmitter driver of the transmitter winding oscillators 210–230 according to this invention that includes the transmitter winding 122. As shown in FIG. 4, in the transmitter driver circuit 300, an impedance transformer 20 is formed by one of the transmitter windings 122 of the transducer 120, a first capacitor 350 and a second capacitor 360. In particular, the impedance transformer 20 is formed by connecting a first terminal of the first capacitor 350 to the output terminal of an operational amplifier 310, at the input node A. A second terminal of the capacitor 350 is connected to a first end of the transmitter winding 122 at a node C. The second end of the transmitter winding 122 is connected at a node B to ground. The second capacitor 360 is connected to the node B and to the input node A between the output of the operational amplifier 310 and the first terminal of the first capacitor 350.

As shown in FIG. 4, a third capacitor 320 is connected by a signal line 322 to ground 302 and by a second signal line 324 to a first resistor 330. The other end of the first resistor 330 is connected to the inverting input of the operational amplifier 310. A second resistor 340 is connected by a signal line 342 to the input node A and by a signal line 344 to the inverting input of the operational amplifier to form a feedback loop between the output of the operational amplifier 310 and the inverting input of the operational amplifier 310. Thus, the first and second resistors 330 and 340 and the operational amplifier 310 form an amplifier with positive gain. The third capacitor 320 holds the direct current bias voltage of the amplifier input. As discussed above, the first and second capacitors 350 and 360 and the transmitter winding 122 form the resonator.

The node C of the resonator is connected by a signal line 352 to a fourth capacitor 370. The other end of the fourth capacitor 370 is connected by a signal line 372 to the non-inverting input of the operational amplifier 310 and to a signal line 374 extending between the first ends of each of a third resistor 380 and a fourth resistor 390. The other end of the third resistor 380 is connected by a signal line 382 to the power supply voltage $V_{cc}$. In contrast, the other end of the fourth resistor 390 is connected by the signal line 392 to ground 302. The third capacitor 370 and the third and fourth resistors 380 and 390 provide a phase shift portion of the transmitter driver circuit 300. In particular, the third and fourth resistors 380 and 390 provide positive phase shift that compensates for any negative phase shift in the amplifier. As a result, the open-loop phase shift is 0°. As is well-known in the art, this is a necessary condition for oscillation. The third and fourth resistors 380 and 390 also set the direct current bias for the amplifier.

As shown in FIG. 4, the operational amplifier 310 is a device having an enable input 314 to which one of the enable signal lines 112, 114 and 116 are connected. In FIG. 4, the enable signal line 112 is shown connected to the enable input 314.

In operation, when the controller 110 outputs a signal on the enable signal line 112 to activate the operational amplifier 310, the operational amplifier 310 goes from a high impedance state to a low impedance state and the internal bias circuitry of the operational amplifier 310 is turned on. A signal from the operational amplifier 310 is output from the output terminal on the signal line 312 and propagates through the impedance transformer 20 and the third capacitor 370 and the third and fourth resistors 380 and 390 that form the phase shifter, and is fed back to the non-inverting input of the operational amplifier 310. The impedance transformer 20 attenuates and phase-shifts frequencies other than the tuned center frequency, so that the closed-loop gain is sufficient for sustained oscillation only at the center frequency. In various exemplary embodiments, this tuned center frequency is about 10 MHz.

As indicated above, at the tuned center frequency, the impedance transformer 20 acts like a traditional wound transformer that changes the impedance of the load to the desired impedance at the input frequency. There are two different degrees of freedom in the impedance transformer 20. The resonant frequency and the input impedance.

In one exemplary embodiment of the transmitter driver 200 shown in FIG. 4, based on the characteristics of one exemplary inductive position transducer, the equivalent alternating current resistance of the transmitter winding 122 is about 260 mΩ when the center tuned frequency is about 10 MHz. The inductance of the transmitter winding 122 is about 47 nH. The wiring has an additional inductance of about 15 nH. As previously stated, the resistive load of the transmitter winding is on the order of 1Ω. Likewise, the driving portion of transmitter driver circuit 300, including the operational amplifier 310, has similarly low output impedance, on the order of 1Ω. Thus, one may think it appropriate to match the impedances at approximately this level.

However, the inventors have found that the excessive current drawn by such low-level resistive loads exceeds the range of normal function of the practical components tested in the place of the operational amplifier 310, introducing considerable distortion and other unwanted problems that vary considerably among various commercially available operational amplifiers. Under these conditions, for practical reasons, the capacitances $C_1$ and $C_2$ of the first and second capacitors 350 and 360, respectively, are selected to present a resistive load of about 10Ω to the output terminal of the operational amplifier 310. In particular, the inventors have found when testing the transmitter driver circuit 300 shown in FIG. 4 over a range of load impedances, the operational amplifier 310 outputs an acceptable waveform with the most power when loaded at about 10Ω, using these values.

In various exemplary embodiments, the fourth capacitor 370 is a variable capacitor having a capacitance range of about 4.5 pF to about 65 pF. The fourth capacitor 370 is tuned to a value that provides a maximal peak-to-peak voltage across the transmitter winding 122. Thereafter, a fixed capacitor of that value may be implemented in place of the variable capacitor for the fourth capacitor 370. In various exemplary embodiments, the first, third and fourth resistors 330, 380 and 390 have resistances of approximately 1 kΩ, while the second resistor 340 has a resistance of about 3 kΩ. The first capacitor 350 has a capacitance $C_1$ of about 6.8 nF, the second capacitor 360 has a capacitance $C_2$ of about 10 nF, the third capacitor 320 has a capacitance of about 0.1 μF, while the fourth capacitor 370 is a variable capacitor as outlined above.

It should be appreciated, however, that these values are specific to a particular operational amplifier 310 and transmitter winding 122. The particular values for each of the first-fourth capacitors and the first-fourth resistors will be a design choice, and tuned to obtain and/or trade off particular transducer response characteristics desired by the designer, given the practical component choices. In practice, the particular values will not necessarily correspond to the best values predicted according to conventional RF circuit design theory. Rather, the inventors have found that, due to the non-ideal behavior of real components, it is important to determine and/or confirm the best circuit parameters by actual experiment with the expected inductive position transducer and various operational amplifier candidates.

For example, Table 1 shows the unpredictable variation in transmitter voltage performance obtained with the previously described transmitter driver circuit of FIG. 4, when VCC=5.0 Volts, and implemented using selected commercially available operational amplifiers. It should also be noted that the peak-to-peak transmitter voltage can exceed the supply voltage, with careful selection of components.

TABLE 1

| Number | Manufacturer | Current Draw | Transmitter Voltage |
|---|---|---|---|
| AD8023AR | Analog Devices | 73 mA | 5.34 Vp-p |
| CLC5623 | Comlinear | 71 mA | 4.2 Vp-p |
| LT1399CS | Linear Technology | 40 mA | 2.28 Vp-p |

Figure 5:
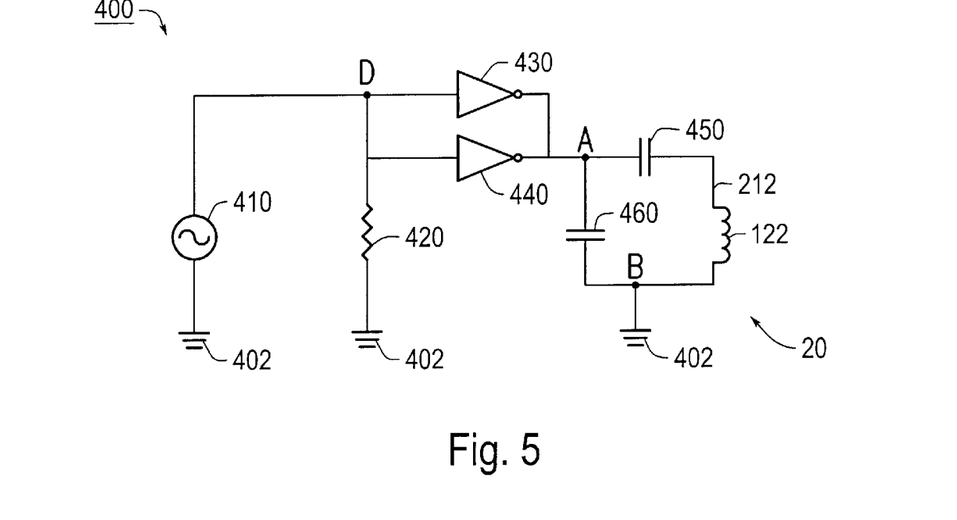
FIG. 5 is a schematic diagram of a second exemplary embodiment of the transmitter winding oscillator and associated transmitter winding of FIG. 2.

FIG. 5 is a schematic diagram of a digital transmitter driver circuit 400 that is usable in the transmitter winding oscillators 210–230 that includes the transmitter winding 122. As shown in FIG. 5, the digital transmitter driver 400 includes a function generator 410, a resistor 420, a pair of inverters 430 and 440 that are connected in parallel, and the impedance transformer 20. As in the previous exemplary embodiments, the impedance transformer 20 includes a first capacitor 450 connected to the input node A and in series with the transmitter winding 122, which is connected to a node B. The node B is further connected to ground 402 and to a second capacitor 460 that is connected in parallel with the serially-connected first capacitor 450 and the transmitter winding 122 between the nodes A and B.

The input terminals of the first and second parallel-connected inverters 430 and 440 are connected to a node D. The output terminal of the function generator 410 and one end of the resistor 420 are also connected to the node D. The other ends of the function generator 410 and the resistor 420 are connected to the ground 402. The output terminals of the first and second inverters 430 and 440 are connected to the input node A. The digital transmitter driver circuit 400 shown in FIG. 5 will not provide the single-frequency benefits of the analog transmitter driver circuit 300 shown in FIG. 4. The digital transmitter driver circuit 400 shown in FIG. 5 does, however, provide other benefits of a transmitter winding driver according to this invention, such as a controllable load impedance, and a transmitter voltage that can exceed the power supply voltage.

The digital transmitter driver circuit 400 shown in FIG. 5 is derived from a test-circuit used to explore the benefits of the various drivers. In general, the digital transmitter driver circuit 400 shown in FIG. 5 would not be used in a product. In various exemplary embodiments, the function generator 410 and terminating resistor 420 would be replaced by other circuitry, such as, for example, a gate array.

In various exemplary embodiments, the resistor 420 has a resistance R of about 50Ω. The first and second capacitors 450 and 460 and the transmitter winding 122, in this exemplary embodiment, have the same values as outlined with respect to FIG. 4. It should be noted that, when testing the transmitter driver circuit 400 shown in FIG. 5, using selected commercially available digital drivers, a range of unpredictable results similar to those shown in Table 1 were obtained. Therefore, due to the non-ideal behavior of such real components, the inventors have discovered that it is important to determine and/or confirm the best circuit parameters by actual experiment with the expected inductive position transducer and various digital driver candidates.

Figure 6:
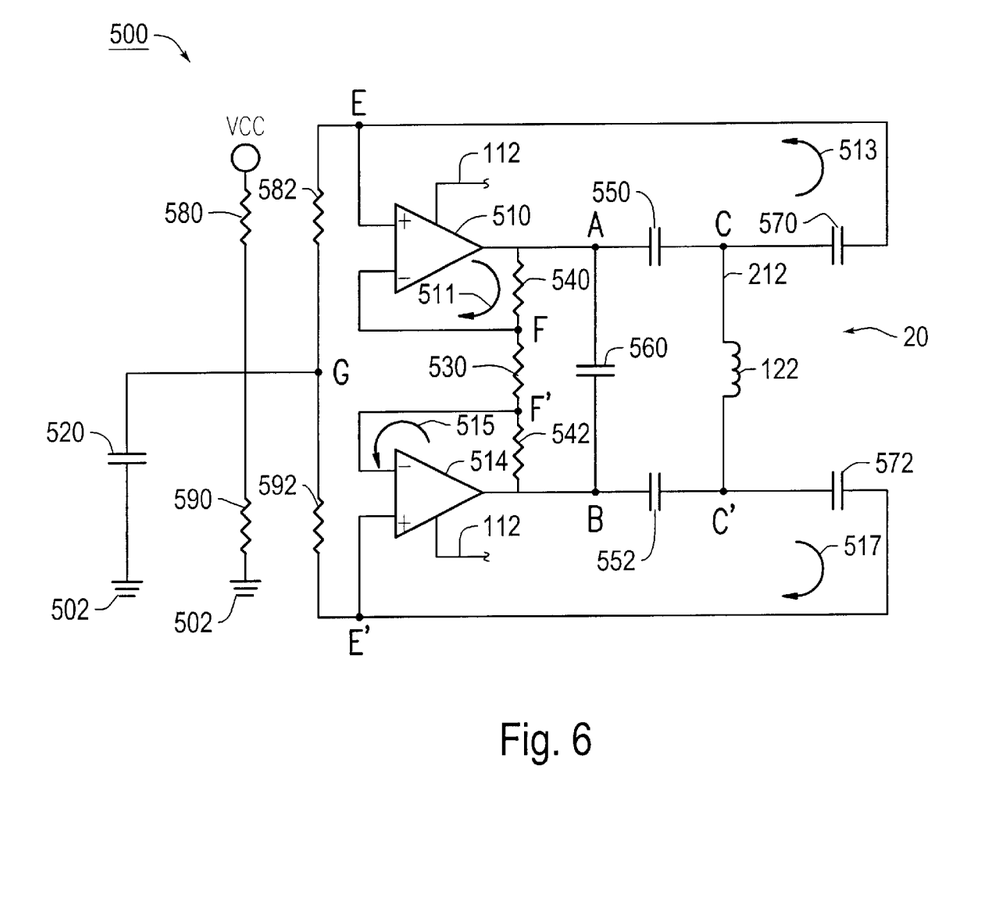
FIG. 6 is a schematic diagram of a third exemplary embodiment of a transmitter winding oscillator and associated transmitter winding of FIG. 2.

FIG. 6 is a circuit diagram illustrating a third exemplary embodiment of the transmitter winding oscillators 210–230 that includes the transmitter winding 122 according to this invention. In particular, the transmitter driver circuit 500 shown in FIG. 6 is a double-ended oscillator, in contrast to the circuit shown in FIG. 4, which is a single-ended oscillator. In particular, as shown in FIG. 6, the double-ended oscillator transmitter driver circuit 500 includes a first operational amplifier 510 and a second operational amplifier 514.

A first feedback loop 511 is connected between the output terminal of the first operational amplifier 510 and the inverting input of the first operational amplifier 510. Similarly, a feedback loop 515 connects the output terminal of the second operational amplifier 514 and the inverting input of the second operational amplifier 514. A second feedback loop 513 connects the output terminal of the first operational amplifier 510 and the non-inverting input of the first operational amplifier 510. Likewise, a second feedback loop 517 connects the output terminal of the second operational amplifier 514 to the non-inverting terminal of the second operational amplifier 514. The circuit elements forming these output loops will be discussed in greater detail below.

Although it is not as readily seen in FIG. 6, the impedance transducer 20 is included in the double-ended oscillator transmitter driver circuit 500, and is shared between the two operational amplifier sub-circuits. In particular, with respect to the first operational amplifier 510 and the second operational amplifier 514, the impedance transformer 20 comprises a first capacitor 550 and a second capacitor 560 as well as the transmitter winding 122 and a third capacitor 552.

In particular, with respect to the first operational amplifier 510, which is connected to the input node A, the first capacitor 550, the transmitter winding 122 and the third capacitor 552 are connected in series between the input nodes A and B, while the second capacitor 560 is connected in parallel with the series-connected first capacitor 550, the transmitter winding 122, and the third capacitor 552 between the input nodes A and B. With respect to the second operational amplifier 514, connected to the input node B, the third capacitor 552, the transmitter winding 122 and the first capacitor 550 are connected in series between the input nodes B and A, while the second capacitor 560 is connected in parallel with the series-connected third capacitor 552, the transmitter winding 122 and the first capacitor 550 between the input nodes B and A.

Similarly, relative to the first and second resistors 330 and 340 discussed above with respect to the single-ended oscillator transmitter driver circuit 300 shown in FIG. 4, each of the first and second operational amplifiers 510 and 514 use a pair of resistors to form a positive gain amplifier. In particular, the first operational amplifier 510 uses a first resistor 530 and a second resistor 540, which is connected between the input node A and a node F connected to the inverting input of the first operational amplifier 510, to form the first feedback loop 511. Similarly, with respect to the second operational amplifier 514, the first resistor 530 and a third resistor 542, which is connected between the input node B and a node F', connected to the inverting input of the second operational amplifier 514 forms the first feedback loop 515. Thus, the first resistor 530 is shared between the first and second operational amplifiers 510 and 514 in the same way that the second capacitor 560 is shared between the first and second operational amplifiers 510 and 514.

With respect to the first operational amplifier 510, in the second feedback loop 513, a fourth capacitor 570 is connected between the node C and a node E. The node E is connected to the non-inverting input of the first operational amplifier 510. Similarly, with respect to the second operational amplifier 514, a fifth capacitor 572 is connected between the node C' and a node E'. The node E' is connected to the non-inverting input of the second operational amplifier 514. Thus, each of the fourth and fifth capacitors 570 and 572 correspond to the fourth capacitor 370 of the single-ended oscillator transmitter driver circuit 300 shown in FIG. 4.

A fourth resistor 580 is connected between the power supply voltage $V_{cc}$ and a node G, while a fifth resistor 590 is connected between the node G and the ground 502. Similarly, a sixth resistor 582 is connected between the nodes E and G, while a seventh resistor 592 is connected between the nodes E' and G. Finally, a sixth capacitor 520 is connected between the node G and the ground 502.

In particular, it should be appreciated that the sixth capacitor 520 corresponds to the first capacitor 320 of the single-ended oscillator transmitter driver circuit 300 shown in FIG. 4. Similarly, with respect to the first operational amplifier 510, the fourth capacitor 570 and the sixth resistor 582 form the phase shifter that corresponds to the phase shifter formed by the fourth capacitor 370 and the third and fourth resistors 380 and 390 in the phase shift portion of the of the single-ended oscillator transmitter driver circuit 300 shown in FIG. 4. Likewise, the fifth capacitor 572 and the seventh resistor 592 form the phase shifter for the second operational amplifier 514.

The fourth and fifth resistors 580 and 590 provide the dc bias for the amplifier input for both the first and second operational amplifier 510 and 514 in the same way that the third and fourth resistors 380 and 390 provide the dc bias for the amplifier input in the single-ended oscillator transmitter driver circuit 300 shown in FIG. 4. Thus, in the double-ended oscillator transmitter driver circuit 500 shown in FIG. 6, the dc bias function and the phase shifting function, which is provided by the single set of resistors 380 and 390 and the single-ended oscillator transmitter driver circuit 300 shown in FIG. 4 is provided separately by the fourth and fifth resistors 580 and 590, and the sixth and seventh resistors 582 and 592, in the double-ended oscillator transmitter driver circuit 500.

In particular, in operation, the first and second operational amplifiers 510 and 514 are connected in a differential mode. Thus, the outputs of the operational amplifiers 510 and 514 will swing in opposite directions from each other. Similarly to the single-ended oscillator transmitter driver circuit 300 shown in FIG. 4, the first-third resistors 530, 540 and 542 set the gain for the first and second operational amplifiers 510 and 514, as outlined above. It should be appreciated that, in the exemplary embodiment of the double-ended oscillator transmitter driver circuit 500 shown in FIG. 6, emphasis has been placed on circuit symmetry, rather than minimizing the number of separate circuit elements in the double-ended oscillator transmitter driver circuit 500. Thus, it should be appreciated that, in various other exemplary embodiments of the double-ended oscillator transmitter driver circuit 500, various ones of the first-fifth capacitors 550, 552, 560, 570 and 572, and various ones of the first-seventh resistors 530, 540, 542, 580, 582, 590 and 592 can be combined into single circuit elements.

In one exemplary embodiment of the double-ended oscillator transmitter driver circuit 500 shown in FIG. 6, each of the first-seventh resistors 530, 540, 542, 580, 582, 590 and 592 each have a resistance R of about 1 kΩ. The first and third capacitors 550 and 552 each have a capacitance $C_1$ and $C_3$ of about 12 nF, while the second capacitor 560 has a capacitance of $C_2$ of about 10 nF. The fourth and fifth capacitors 570 and 572, like the fourth capacitor 370, are variable capacitors. In this exemplary embodiment, these variable capacitors were set to their minimal setting of 5.4 pF. The sixth capacitor 520 has a capacitance $C_6$ of approximately 0.1 $\mu$F. The inductance L of the transmitter winding 122, as above, is approximately 47 nH. In tests, the inventors have achieved transmitter voltage performance as high as 15.5 Volts peak-to-peak, with the previously described transmitter driver circuit of FIG. 6, VCC=5.0 Volts, implemented using selected commercially available operational amplifiers.

It should be appreciated that, in the various transmitter driver circuits 300–500 shown in FIGS. 4–6, in various exemplary embodiments, the driver circuits are implemented in a layout placing them close to the transmitter winding(s) to be driven, to minimize the stray effects of wiring and connections which may otherwise intervene, and to provide more-predictable and stable performance characteristics for the inductive position transducer. For example, a driver circuit and its associated transmitter winding(s) may be assembled, or directly fabricated, onto a shared member, such as a printed circuit board, or a flex-circuit, or the like.

In each of the various exemplary embodiments of the transmitter winding oscillators 210–230 outlined above that includes the impedance transformer 20, by providing both the serially-connected and the parallel-connected capacitors, relative to the transmitter winding 122, two degrees of freedom are provided in selecting capacitances for these capacitors. Thus, the resonant frequency of the impedance transformer 20 can be prescribed or selected independently of the impedance Z of the impedance transformer 20, as outlined above with respect to FIG. 3

As discussed previously, in the conventional transmitter winding drivers, either the resonant frequency or the impedance could be selected, but once either the resonant frequency or the impedance was selected, the impedance or the resonant frequency, respectively, was fixed. Thus, by allowing both the resonant frequency and the impedance to be prescribed or selected independently of each other, the impedance transformer, or dual capacitor resonator, 20 enables load-inductance transmitter windings to be driven efficiently.

Additionally, the voltage across the transmitter winding that can be obtained using the impedance transformer, or dual capacitor resonator, 20 is higher than can be obtained in a single-capacitor resonator, as shown in FIG. 8. Thus, the resolution of the transducer can be improved. At the same time, because the resonant frequency of the impedance transformer, or dual-capacitor resonator, 20 can be tuned, a sine wave can be provided tuned to the resonant frequency such that the transmitter winding can be driven more efficiently, and the transducer output determined more accurately, than with other, distorted waveforms.

Moreover, because the harmonics can be removed from the drive signal, less electromagnetic radiation is radiated to the environment. This allows the transmitter driver to be used in more EMF-sensitive environments, with lower-cost inductive transducer packaging.

It should also be appreciated that, in the various transmitter driver circuits 300 500 shown in FIGS. 4 6, the oscillation frequency of the transmitter driver circuits 300 500 track any drift of the transmitter winding. Thus, the oscillation of the transmitter driver circuits 300 500 will stay on-resonance better than transmitter drivers that are controlled by an externally-located oscillator circuit. That is, by including the transmitter winding inductance into the resonating circuit that sets the resonant frequency of the oscillator, the oscillator is assured to produce a maximal drive signal at the precise frequency of the resonator.

Because the tolerances of the component values, such as the capacitance, resistance, and inductance, of the various capacitors, resistors and the transmitter winding will almost certainly vary, it is unlikely that the actual resonant frequency of any actual drive circuit built according to the principles discussed above and shown in FIGS. 4–6 will be exactly the designed frequency. However, the transmitter driver circuits 300 500 will automatically find the oscillation frequency that produces the strongest output signal from the transducer.

Thus, the oscillating transmitter driver circuits according to this invention avoid many problems associated with prior art oscillating transmitter drivers for inductive position transducers. For example, the ringing oscillator disclosed in the incorporated 389 and 387 patents is generally unsuitable for small inductances, such as those associated with compact, high accuracy, inductive position transducers, and furthermore, uses large capacitance capacitors to generate a strong enough signal through the transmitter winding of compatible transducers. However, such large capacitance capacitors take a significant time to charge up, thus limiting the sampling frequency obtainable with this ringing circuit. Furthermore, the large-capacitance capacitor must be charged up to the same voltage level for each sample, and the transistor-implemented switch must be able to handle the large current loads flowing from the large-capacitance capacitor through the transmitter winding.

In contrast, other conventional continuous drivers inherently create multiple-frequency waveforms, and are often unable to create a pure sine wave. Furthermore, in many such circuits, it is necessary to separate the oscillator from the resonator. Therefore, such multiple-frequency driver circuits, such as those that use crystal oscillators, are sensitive to drifting of the resonator frequency that may occur due to aging or environmental effects in the transducer parameters or in the other circuit elements. It is also harder with such multiple-frequency driver circuits to precisely control the signal that the transducer receives.

As outlined above, the output signal from the transducer 120 is input through the input multiplexer 130 to the synchronous demodulator 140, which synchronously demodulates a plurality of signal cycles based on signals from the transmitter driver over the signal lines 216, 226 and 236. Using the transmitter drivers according to this invention, 64 cycles can easily be used by the synchronous demodulator 140. Furthermore, the synchronous demodulator 140 can operate over a range of about 6 to about 200 cycles. As is well known in the art, relative to the ringing circuit disclosed in the 387 and 389 patents, averaging over any number of cycles usually provides a higher accuracy signal than trying to capture the peak, as is done in the ringing circuits shown in the 389 and 387 patents.

With respect to the double-ended oscillator transmitter driver circuit 500 shown in FIG. 6 relative to the single-ended oscillator transmitter driver circuit 300 shown in FIG. 4, capacitive coupling between the transducer's transmitter and receiver windings can occur in the single-ended oscillator transmitter driver circuit 300. In contrast, in the double-ended oscillator transmitter driver circuit 500, the net voltage across the transmitter winding 122 is essentially zero. Therefore, there is no voltage signal that passes through the transmitter winding 122. As a result, there is little or no capacitive coupling in the transducer using the double-ended oscillator transmitter driver circuit 500. In addition, because the double-ended oscillator essentially provides twice as much signal strength at the same frequency, the double-ended oscillator transmitter driver circuit 500 allows the same signal magnitude to be obtained by the synchronous demodulator 140 in essentially half the time. Thus, the double-ended oscillator transmitter driver circuit 500 has an effectively shorter sampling window.

It should also be appreciated that, if the single-ended and double-ended oscillator transmitter driver circuits 300–500 shown in FIGS. 4–6 were driven at slightly off the resonance frequency, the phase shift requirements of the single-ended and double-ended oscillator transmitter driver circuits 300–500 could be relaxed. In such cases, the phase shift portion and the resulting feedback loop to the non-inverting input of the first operational amplifier 310 and the first and second operational amplifiers 510 and 514 could be omitted. Nevertheless, such modified circuits retain the benefits of independently tuning the resonant frequency and the impedance of the impedance transformer portion of such circuits.

As indicated above, with selected commercially available operational amplifiers and digital drivers, a range of unpredictable results were obtained for the various transmitter driver circuits 300–500 shown in FIGS. 4–6. Due to the non-ideal behavior of real components, in the design ranges compatible with the characteristics of advanced inductive position transducers, the results can only be predicted very roughly according to the design practices conventional in the field of RF circuit design.

Thus, it should be appreciated that the various exemplary transmitter driver circuits according to the principles of this invention have been developed and tested to provide particular characteristics of design versatility, adaptability and robustness as discussed above, which are of great utility in the field of inductive position transducers. Furthermore, as disclosed herein, due to the non-ideal behavior of real components, in the design ranges compatible with the characteristics of advanced inductive position transducers, it may be important to deviate from conventional design principles, such as ideal impedance matching and the like, in order to provide the best overall performance with the expected inductive position transducers and various transmitter driver component candidates.

It will be appreciated by those skilled in the art that many other variations can be made to the various oscillator transmitter driver circuits 300–500 shown in FIGS. 4–6 without departing from the spirit and scope of this invention.

It should also be appreciated that, as inductive position transducer elements become miniaturized, various known, and later developed, forms of the miniaturized inductive position transducer elements may be used in a wide variety of applications other than those described herein. For example, they may be used as displacement detectors and/or null detectors for detecting and/or serving the motion of members included in a wide variety of instruments and other products which have end purposes other than position measurement. These various known, and later developed, forms of miniaturized inductive position transducer elements, usable in a wide variety of applications, are all drivable according to the principles of this invention, and therefore fall within the scope of the term inductive position transducer, as used herein.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A drive circuit usable to drive at least one transmitter winding of an inductive position transducer, the at least one transmitter winding having a first winding terminal, a second winding terminal and a winding impedance, the drive circuit comprising:

an impedance transformer portion connected to the first and second winding terminals, the impedance transformer portion having at least one input node which is separated from each of the first and second winding terminals by at least one impedance transformer portion component;

at least one power source portion connected to the at least one input node, the at least one power source portion having an output impedance during operation, and the at least one power source portion capable of providing an oscillating drive signal at the at least one input node; and a phase shift portion connected to at least one of the first and second winding terminals and a terminal of the at least one power source, wherein a resonator comprising at least the impedance transformer portion and the at least one transmitter winding has a resonant frequency and a load impedance presented to the at least one power source during operation that are independently prescribable relative to each other.

2. The drive circuit of claim 1, wherein each at least one impedance transformer portion component comprises a capacitor.

3. The drive circuit of claim 1, wherein the independently prescribable resonant frequency determines the frequency of the oscillating drive signal.

4. The drive circuit of claim 3, wherein the independently prescribable resonant frequency and the frequency of the oscillating drive signal are the same.

5. The drive circuit of claim 4, wherein the independently prescribable resonant frequency changes in correspondence to changes in the impedance of the at least one transmitter winding.

6. The drive circuit of claim 1, wherein the at least one power source portion comprises a constant voltage supply and at least one amplifier.

7. The drive circuit of claim 6, wherein the at least one amplifier comprises one of an operational amplifier and an inverter.

8. The drive circuit of claim 6, wherein:

the drive circuit further comprises at least one phase shift portion having a first phase-shift portion node connected to one of the first and second winding terminals and having a second phase-shift portion node, and the at least one amplifier comprises an operational amplifier having an inverting terminal, a non-inverting terminal, and an output terminal;

the output terminal is connected to the at least one input node and to a first terminal of at least one gain-setting resistor;

the inverting terminal is connected to a second terminal of the at least one gain-setting resistor; and the non-inverting terminal is connected to the second phase-shift portion node of the at least one phase shift portion.

9. The drive circuit of claim 8, wherein the at least one phase shift portion comprises at least one phase shift portion capacitor having a first terminal connected to one of the first and second winding terminals and a second terminal connected to the non-inverting terminal of the at least one operational amplifier and to at least one phase shift portion resistor.

10. The drive circuit of claim 9, wherein the impedance transformer portion comprises a first impedance transformer capacitor connected between the at least one input node and a second node of the impedance transformer portion, and a second impedance transformer capacitor having a first terminal connected to the at least one input node and a second terminal connected to one of the first and second winding terminals, that one of the first and second winding terminals also being connected to the first terminal of the at least one phase shift portion capacitor, the other one of the first and second winding terminals connected to the second node of the impedance transformer portion.

11. The drive circuit of claim 6, wherein:

the at least one input node of the impedance transformer portion comprises a first impedance transformer portion input node and a second impedance transformer portion input node; and the at least one amplifier comprises a first operational amplifier and a second operational amplifier, each having respective output, inverting, and non-inverting terminals; and the drive circuit further comprises:
a first phase shift portion having a respective first phase-shift portion node connected to a first one of the first and second winding terminals, and having a respective a second phase-shift portion node, and
a second phase shift portion having a respective first phase-shift portion node connected to the other one of the first and second winding terminals, and having a respective a second phase-shift portion node;

output terminal of the first amplifier is connected to the first impedance transformer portion input node and to a first terminal of a first gain-setting resistor;

the inverting terminal of the first amplifier is connected to a second terminal of the first gain-setting resistor;

the non-inverting terminal of the first amplifier is connected to the respective second phase-shift portion node of the first phase shift portion;

the output terminal of the second amplifier is connected to the second impedance transformer portion input node and to a first terminal of a second gain-setting resistor;

the inverting terminal of the second amplifier is connected to a second terminal of the second gain-setting resistor; and the non-inverting terminal of the second amplifier is connected to the respective second phase-shift portion node of the second phase shift portion.

12. The drive circuit of claim 11, wherein:

the first phase shift portion comprises at least one first phase shift portion capacitor having a respective first terminal connected to a first one of the first and second winding terminals, and a respective second terminal connected to the non-inverting terminal of the first amplifier and to at least one respective first phase shift portion resistor; and the second phase shift portion comprises at least one respective phase shift portion capacitor having a respective first terminal connected to the other one of the first and second winding terminals, and a respective second terminal connected to the non-inverting terminal of the second amplifier and to at least one respective second phase shift portion resistor.

13. The drive circuit of claim 12, wherein the impedance transformer portion comprises:

a first impedance transformer capacitor connected between the first and second impedance transformer portion input nodes; and a second impedance transformer capacitor having a respective first terminal connected to the first impedance transformer portion input node, and having a respective second terminal connected to the one of the first and second winding terminals, that one of the first and second winding terminals also being connected to a terminal of a first phase shift portion capacitor; and a third impedance transformer capacitor having a respective first terminal connected to the second impedance transformer portion input node, and having a respective second terminal connected to the one of the first and second winding terminals, that one of the first and second winding terminals is also connected to a terminal of a second phase shift portion capacitor.

14. The drive circuit of claim 6, wherein the peak operating voltage between the first and second winding terminals of the at least one transmitter winding is greater that the voltage of the constant voltage supply.

15. The drive circuit of claim 6, wherein the peak operating voltage between the first and second winding terminals of the at least one transmitter winding is greater than two times the voltage of the constant voltage supply.

16. The drive circuit of claim 1, wherein the resonant frequency is greater than about 2 MHz.

17. The drive circuit of claim 16, wherein the resonant frequency is greater than about 5 MHz.

18. The drive circuit of claim 17, wherein the resonant frequency is greater than about 10 MHz.

19. The drive circuit of claim 1, wherein the winding impedance of the at least one transmitter winding comprises an inductance of less than about 200 nH.

20. The drive circuit of claim 19, wherein the winding impedance of the at least one transmitter winding comprises an inductance of less than about 100 nH.

21. The drive circuit of claim 20, wherein the winding impedance of the at least one transmitter winding comprises an inductance of less than about 50 nH.

22. The drive circuit of claim 1, wherein:

the winding impedance of the at least one transmitter winding comprises a resistive component of less than about 5 ohms; and the independently prescribable load impedance presented to the at least one power source during operation comprises a resistive component of at least about three times the transmitter winding resistive component.

23. The drive circuit of claim 22, wherein the independently prescribable load impedance presented to the at least one power source during operation comprises a resistive component of at least about 5 ohms.

24. The drive circuit of claim 23, wherein the independently prescribable load impedance presented to the at least one power source during operation comprises a resistive component of at least about 10 ohms.

25. The drive circuit of claim 1, wherein:

the output impedance of the at least one power source portion during operation comprises a resistive component of less than about 10 ohms; and the independently prescribable load impedance presented to the at least one power source during operation comprises a resistive component of at least about 1.25 times the resistive component output impedance of the at least one power source portion during operation.

26. The drive circuit of claim 25, wherein the independently prescribable load impedance presented to the at least one power source during operation comprises a resistive component of at least about 5 ohms.

27. The drive circuit of claim 26, wherein the independently prescribable load impedance presented to the at least one power source during operation comprises a resistive component of at least about 10 ohms.

28. The drive circuit of claim 1, wherein the at least one transmitter winding encloses an effective loop area.

29. The drive circuit of claim 28, wherein the effective loop area is less than about 100 square millimeters.

30. The drive circuit of claim 29, wherein the effective loop area is less than about 50 square millimeters.

31. The drive circuit of claim 30, wherein the effective loop area is less than about 25 square millimeters.

32. The drive circuit of claim 1, wherein the drive circuit and the at least one transmitter winding are located in close proximity to each other.

33. The drive circuit of claim 32, wherein the drive circuit and the at least one transmitter winding are located on a shared member.

34. The drive circuit of claim 33, wherein the at least one transmitter winding is generally planar and the shared member is one of a printed circuit board, a flex-circuit, and a silicon substrate.

35. The drive circuit of claim 32, wherein the drive circuit and the at least one transmitter winding are included in a readhead of the inductive position transducer.

* * * * *